AMPLITUDE DETERMINED MICROWAVE LOGIC CIRCUIT

Filed March 31, 1958 2 Sheets-Sheet 1

INVENTOR.
MAX P. FORRER.
BY [signature]
ATTORNEY.

May 29, 1962 M. P. FORRER 3,037,168

AMPLITUDE DETERMINED MICROWAVE LOGIC CIRCUIT

Filed March 31, 1958 2 Sheets-Sheet 2

INVENTOR.
MAX P. FORRER.
BY
[signature]
ATTORNEY.

United States Patent Office 3,037,168

Patented May 29, 1962

3,037,168
AMPLITUDE DETERMINED MICROWAVE LOGIC CIRCUIT

Max P. Forrer, Palo Alto, Calif., assignor to General Electric Company, a corporation of New York Filed Mar. 31, 1958, Ser. No. 725,338
19 Claims. (Cl. 328—94)

This invention relates to non-linear electrical wave transducers and more particularly to traveling-wave tube apparatus for transmitting preferentially electromagnetic waves having amplitudes greater than a predetermined value.

The desirability of employing apparatus providing preferential transmission for electromagnetic waves of large signal amplitude frequently arises. For instance, a regenerative pulse generator requiring a wave expander is described by C. C. Cutler, "The Regenerative Pulse Generator," Proc. IRE, vol. 43, pp. 140–148; February 1955. The regenerative pulse generator consists of a feedback loop around which a pulse recirculates indefinitely, producing at each traversal a response at the loop output terminals. Such a pulse would soon be degraded unless the effects of noise and distortion were counteracted in some way. An expander provides the necessary function, emphasizing the highest amplitude point in the re-circulating pulse, effectively discriminating against noise and reflections, and acting to shorten the pulse until its length is limited by the frequency response of the circuit. The essential requirement for the expander is defined as that of providing more gain, or less attenuation, for a high level signal than for a low level signal.

A logical AND-gate for a high-speed digital computer is another example wherein such preferential wave transmission apparatus can be beneficially employed. In a high-speed digital computer data may be represented by extremely short bursts or pulses of microwave energy. In a binary digital computer of this type a pulse of microwave energy may be utilized to represent a 1 and the absence of such a pulse to represent a 0. The logical AND-gate provides no output signal when a single input pulse is delivered thereto, but delivers a large output signal when two input pulses are concurrently delivered thereto. Thus, apparatus providing preferential transmission for the higher level input signal provided when the two concurrent input pulses are superposed is useful as an AND-gate in a high-speed digital computer.

Prior art devices for providing the above-described preferential wave transmission have been limited by the upper frequency at which they can effectively transmit electromagnetic waves, or have been limited by narrow bandwidth so that they cannot function properly when very short duration pulses are applied. Still other prior art devices are critical in operation and design because they require balanced elements. Moreover, most of these prior art devices attenuate the signals passing therethrough.

To obviate the above-described limitations, this invention includes traveling-wave tubes as part of apparatus adapted to provide the aforementioned preferential wave transmission, inasmuch as traveling-wave tubes are capable of amplifying microwave signals over a broad range of frequencies.

Therefore, it is the principal object of this invention to provide improved apparatus for providing preferential transmission of electrical signals in accordance with the amplitude thereof.

Another object of this invention is to provide apparatus employing traveling-wave tubes for transmitting electromagnetic waves of large amplitude with greater amplification than waves of small amplitude.

Another object of this invention is to provide preferential wave transmission apparatus adapted to operate with wide bandwidth signals in the microwave frequency region.

Another object of this invention is to provide traveling-wave tube apparatus adapted to function as an expander.

Another object of this invention is to provide traveling-wave tube apparatus adapted to function as a logical element in a digital computer.

Another object of this invention is to provide traveling-wave tube apparatus adapted to function as an AND-gate in a binary digital computer.

The foregoing objects are achieved by providing a traveling-wave tube having a pair of output couplers spaced apart along the slow-wave structure thereof. The tube is sufficiently long so that when a large amplitude input signal is coupled to the slow wave structure at the end closest to the electron gun, the electron stream will become saturated when it reaches a point in the region between the two output couplers. The two output coupler signals are applied to a suitable balancing microwave circuit. When a small amplitude input signal is present the electron stream remains unsaturated in the region between the two output couplers, the two output coupler signals cancel each other, and no output signal is provided by the balancing microwave circuit. However, when a large amplitude input signal is present, the saturation of the electron stream in the region between the two output couplers results in output coupler signals that are not cancelled in the balancing microwave circuit, so that an output signal is derived therefrom. The signal amplification available is controllable by adjustment of the spacing between the output couplers. With a given spacing between the output couplers the amplitude of the balancing circuit output signal may be controlled by controlling the current of the electron stream.

When the apparatus is operated as an AND-gate, a single input signal representing a binary 1, is insufficient to saturate the electron stream in the region between the two output couplers, and no output signal is provided by the balancing microwave circuit. However, in the presence of two concurrent cophasal input signals, representing the coincidence of a pair of binary 1's, electron stream saturation occurs in the region between the two output couplers, and an output signal is provided by the balancing microwave circuit.

The invention will be described with reference to the accompanying drawings, wherein.

Figure 1:
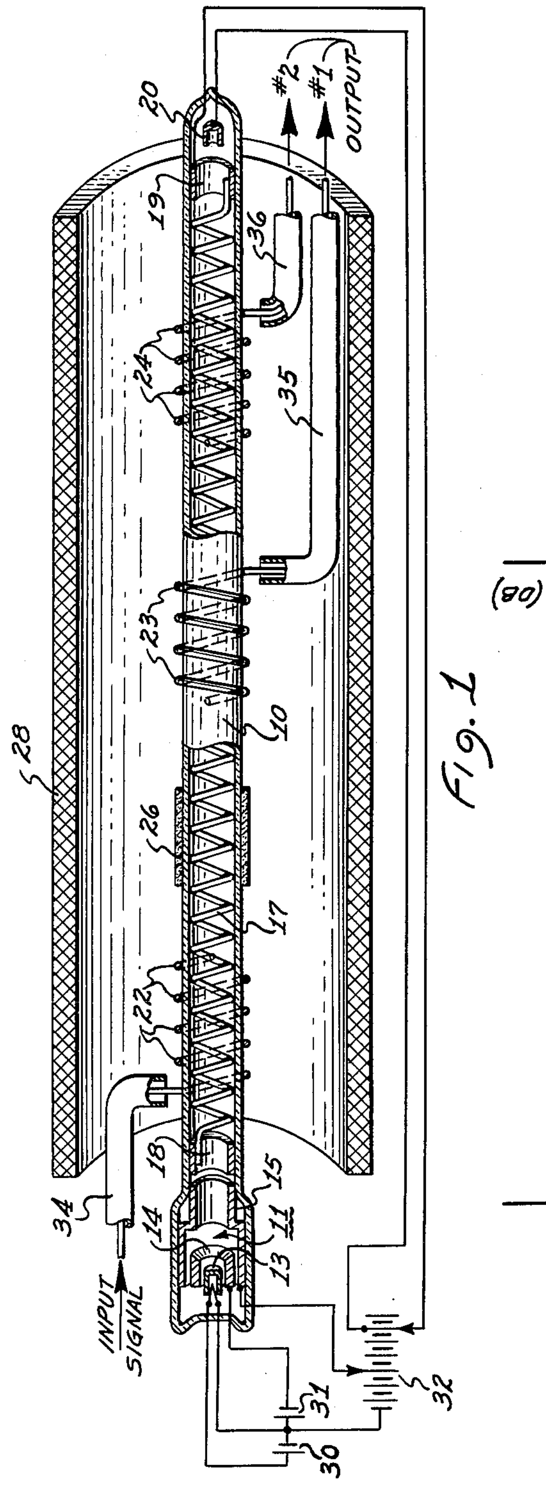
FIGURE 1 is a schematic diagram, partly in cross-section, of traveling-wave tube apparatus useful in the operation of this invention.

The traveling-wave tube apparatus of FIG. 1 includes an evacuated envelope 10, which may be of glass or other suitable dielectric material. An electron gun, designated generally as 11, provides an electron stream which is projected along the axis of the tube. Electron gun 11 comprises an electron emitting cathode 13, which may be indirectly heated, as shown, an electron focusing electrode 14, and an accelerating electrode 15. The electron stream provided by electron gun 11 travels along the axis of the tube and through a helix 17, which is supported by the inside surface of envelope 10 between a pair of helix terminating cylindrical members 18 and 19. The electron stream completes its passage through the tube at a collecting electrode 20. Electromagnetic energy is transferred onto helix 17 near the electron gun end thereof by means of an input coupler 22. Electromagnetic energy is extracted from the helix by a pair of output couplers 23 and 24, which are spaced apart from each other along the axis of the helix. All couplers 22, 23 and 24 are of the helix-to-coaxial-line transducer type, wherein transfer of electromagnetic energy is obtained between two oppositely-wound helices, such as described by W. W. Siekanowicz and F. Sterzer, "A Developmental Wide-Band, 100-Watt, 20 db, S-Band Traveling-Wave Amplifier Utilizing Periodic Permanent Magnets," Proc. IRE, vol. 44, pp. 55–61; January 1956. A dissipative member 26 is disposed along helix 17 between the input coupler 22 and the output coupler 23 and serves to stabilize the operation of the tube by absorbing at least a portion of the high frequency wave traveling along helix 17. A solenoid 28, connected to a suitable source of current, not shown, provides a magnetic focusing field directed along the axis of the tube for preventing dispersion of the electron stream traveling therealong.

The cathode is heated by energy derived from a potential source 30. Focusing electrode 14 is biased by a potential source 31. A potential source 32 connected between cathode 13 and accelerating electrode 15 provides the necessary accelerating voltage to project the electron stream along the axis of the tube. Source 32 also supplies suitable voltages for connection to helix 17 and collecting electrode 20.

Input signals are applied to the tube by means of coaxial line portion 34, which is connected directly to input coupler 22. Output signals are extracted from the tube by coaxial line portions 35 and 36, which are connected directly to respective output couplers 23 and 24.

*Theory of Operation*

The operation of this invention will be described by reference to the following theory of operation, as presently understood. In the traveling wave amplifier of FIG. 1, the wave to be amplified enters the apparatus through coaxial line portion 34, is transferred to the electron gun end of helix 17 by means of input coupler 22, and travels along the helix from the electron gun end toward the collecting electrode end. This wave, also termed the "guided wave," propagates along the helical path with approximately the speed of light. However, the velocity component of the guided wave along the axis of the helix is considerably less than the velocity of light, depending on the radius and pitch of the helix winding. The axial velocity component of the guided wave is approximately equal to the product of the velocity of light and the helix pitch divided by the helix circumference. The helix is actually designed so that the velocity component of the guided wave along the tube axis is reduced to approximately the velocity of the electron stream projected therealong, because amplification of the guided wave is best provided when it can travel in synchronism with the electron stream. Final control of the velocity relationship between guided wave and electron stream may be made by adjustment of the electron stream accelerating voltage. Because the helix provides a relatively slow axial velocity component of the guided wave for interaction with the electron stream, it is termed a "slow-wave structure."

As the electrons progress in synchronism with the guided wave, there is a cumulative interaction, which results in amplification of the guided wave. The axially-directed field components of the guided wave alter the relative axial positions of the stream electrons, thereby producing a bunching effect, i.e. an electron density modulation in the axial direction. The spacing between bunches corresponds to the axial components of the wavelength of the guided wave. The electron density of the bunches increases along the stream path. The bunches, in turn, interact with the guided wave to transfer energy thereto. So long as the electron bunching effect remains relatively small, the amplitude of the guided wave increases progressively, and the operation is said to be linear. In this mode of operation the power of the guided wave increases exponentially with distance along the tube axis, and the power gain of the tube is constant at any point along the slow-wave structure. Thus, a graph of guided wave output power versus guided wave input power is a straight line, so long as the output power is taken at a point along the slow-wave structure where the aforementioned linear operation prevails. This type of operation is shown by the linear portions of the curves *f* and *g* of FIG. 2, and of FIG. 3.

As the electron bunching effect continues to increase along the tube axis, or if the input wave amplitude is made relatively large, a maximum electron density of the bunches is reached, dictated by repelling space charge forces between the electrons. This saturation in the electron density of the bunches is accompanied by a saturation, or limiting, in the magnitude of the guided electromagnetic wave. Following the region wherein the bunches attain maximum electron density, there is a region of "debunching," accompanied by an actual decrease in magnitude of the guided wave. If the traveling-wave tube is long enough, several cycles of maximum bunching and debunching may take place along the tube axis. Saturation operation is shown by the non-linear portions of curves *f* and *g* of FIG. 2 and of the curve of FIG. 3.

Saturation is accompanied by operation wherein the power gain is no longer constant, that is tube operation departs from linear. Saturation starts at that point in the tube where maximum electron bunching is reached. This point moves towards the tube input end as the input signal level is increased. In other words, the saturation bunching is attained within a shorter tube length, if the input signal is larger. Thus, it is seen that the input signal level determines whether or not the output couplers lie in saturation regions.

*Traveling-Wave Tube Exchanger*

Figure 4:
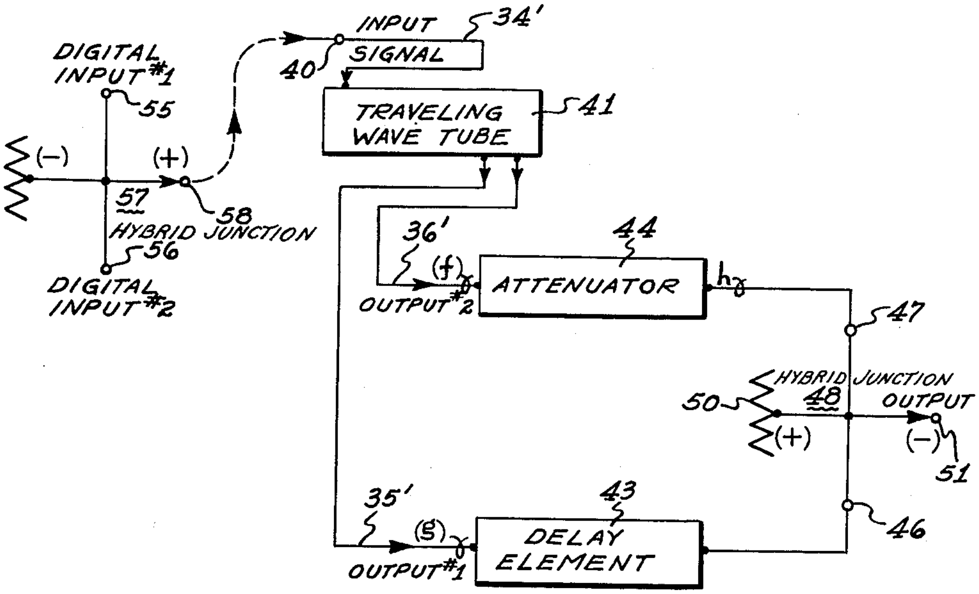
FIGURE 4 is a block diagram of an embodiment of this invention.

The circuit to the right of input terminal 40 in FIG. 4 is an embodiment of this invention adapted to function as an expander. Input signals are transmitted to the circuit from input terminal 40 through a coaxial line portion 34', which corresponds to coaxial line portion 34 of FIG. 1. The input signals transmitted in coaxial line portion 34' are applied to the input coupler of a traveling-wave tube 41, which corresponds to the traveling-wave tube of FIG. 1. A pair of output signals is derived from tube 41 at respective spaced-apart points along the slow-wave structure thereof, as by output couplers 23 and 24 of FIG. 1. These two output signals are transmitted through respectively coaxial line portions 35' and 36', which correspond respectively to coaxial line portions 35 and 36. The output signal transmitted by coaxial line portion 35' is extracted from the slow-wave structure at a point which is closer to the electron gun end of the tube than the point from which the signal transmitted by coaxial line portion 36' is extracted. The first output signal of coaxial line portion 35' is applied to a delay element 43, which introduces a predetermined amount of delay in the signal passing therethrough. A coaxial line stretcher suitable for use as a delay element is described by J. F. Reintjes and G. T. Coate, "Principles of Radar," third edition, McGraw-Hill Book Company, Inc., New York, pp. 853–854, 1952. The second output signal of coaxial line portion 36' is applied to an attenuator 44, which introduces a predetermined amount of attenuation in the signal passing therethrough. A suitable attenuator for this application is described in the aforementioned Reintjes publication, pp. 840–849. The signals delivered by delay element 43 and attenuator 44 are applied to the respective input arms 46 and 47 of a hybrid junction 48. A suitable hybrid junction for this application is described in the aforementioned Reintjes publication, pp. 825–839. A dissipative member 50 terminates one of the output arms of hybrid junction 48, providing a matching impedance therefor. The expander output signal is delivered by hybrid junction output arm 51.

Hybrid junction 48 operates in the following manner. If two cophasal signals of equal amplitude are applied at respective input arms 46 and 47, the entire input power will be dissipated in member 50 and no power will be delivered by output arm 51. If, however, the amplitudes of these two cophasal signals become unequal an output signal is delivered by arm 51. Hybrid junction 48 may be also operated with two antiphasal input signals. In this instance arm 51 would be provided with the impedance matching dissipative member and balanced input signals would be dissipated therein. The other output arm, employed to deliver the expander output signal, would supply no signal unless the input signals became unbalanced in amplitude. Thus, hybrid junction 48 in this invention is operated as a comparison means, adapted to receive a signal at each of its two input arms and to deliver a signal at an output arm representing the degree of inequality between the amplitudes of the two received signals.

Figure 3:
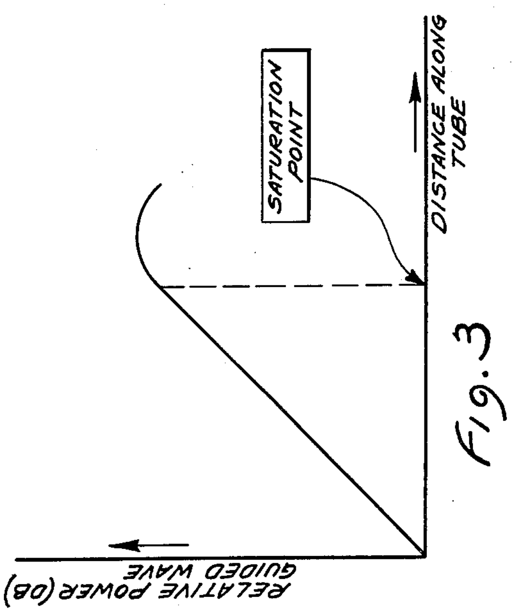
FIGURES 2 and 3 are graphs for explaining the operation of the invention.
Figure 2:
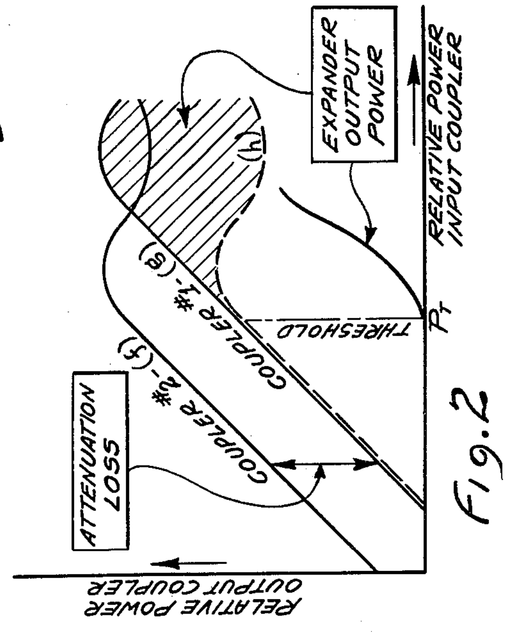

Curves *f* and *g* in FIG. 2 demonstrate that so long as the electron stream remains unsaturated, a greater amount of power is extracted by coupler #2, which corresponds to output coupler 24 of FIG. 1 than by coupler #1, which corresponds to output coupler 23, and that because of the linear type of operation when the stream is unsaturated there is a constant difference between the powers provided by the two output couplers. This difference in extracted powers increases with the distance between the two output couplers, as shown by the curve of FIG. 3, which illustrates the difference in output power available at various locations along the tube axis.

Attenuator 44 is designed to attenuate the second output signal passing therethrough so that it becomes equal in amplitude to the signal provided by the first output coupler 23 (attenuator 44 converts curve *f* to curve *h* in FIG. 2). Thus, the attenuation, in decibels, provided by attenuators 44 is numerically equal to the difference in powers, expressed in decibels, provided by output couplers 23 and 24. This is the case for the linear unsaturated range of operation of the tube, over which range the difference between the power output of the couplers 23 and 24 is constant. In traveling between output couplers 23 and 24 along the helical transmission path, an electromagnetic wave experiences a phase shift proportional to the length of said helical path between the couplers. Delay element 43 is designed to provide a phase delay in the first output signal passing therethrough to compensate for the phase delay of the second output signal caused by the wave traveling between the two output couplers of the helix and the phase delay introduced by attenuator 44. Delay element 43 must, therefore, delay the wave passing therethrough so that it arrives at input arm 46 in proper phase relationship with the attenuated wave arriving at input arm 47. Thus, delay element 43 and attenuator 44 cooperate to supply to hybrid junction 48 a pair of input signals which have the desired phase and amplitude relationship with each other so long as the electron stream is unsaturated at the second output coupler 24.

If, now, the input signal delivered to traveling-wave tube 41 increases in power beyond the threshold point $P_T$ of FIG. 2, so that the electron stream saturates before or when it reaches the second output coupler 24, the signal output power delivered by coupler 24 no longer increases linearly as the signal input power to the tube increases, but instead commences to deviate from the straight line characteristic of non-saturated operation. Under these conditions the power difference of the two output signals is no longer constant, but begins to diminish, as shown by the ordinal difference between curves *f* and *g* of FIG. 2, when input signal power is greater than $P_T$. The power of the signal delivered by attenuator 44 now commences to drop below that of the signal provided by first output coupler 23. Broken curve *h* in FIG. 2 is a graph of the output signal delivered by attenuator 44 as a function of the input signal power to the tube. Consequently, the ordinal difference between curves *g* and *h* represents the difference in amplitude of the two signals applied to input arms 46 and 47 of hybrid junction 48. When these two input signals to hybrid junction 48 become unequal in amplitude an output signal is delivered by output arm 51. As shown in FIG. 2, no output signal is delivered by output arm 51 so long as the traveling-wave tube signal input power is less than the threshold level, $P_T$; but when the signal input power increases beyond the threshold level an increasing signal is delivered by arm 51. Consequently, FIG. 2 illustrates how the circuit of FIG. 4 operates as an expander. FIGURE 2 also illustrates that the output signal amplitude is controllable by adjustment of the spacing between the two output couplers. Increasing the spacing between couplers 23 and 24 increases the ordinal spacing between curves *f* and *g* and, consequently, the output signal amplitude. Thus, it is possible to obtain amplification for large input signals from the apparatus of FIG. 4. Furthermore, this amplification may be varied by varying the current of the electron stream, as by controlling the voltage of electrode 14 or by controlling the voltage of an additional control grid which may be employed in electron gun 11.

Although the expander of this invention has been described using particular microwave apparatus, the invention is not so limited. While the traveling-wave tube employing a helical slow-wave structure offers the conveniences of couplers external to the evacuated envelope, which are therefore readily adjustable, the traveling-wave tube amplifier suitable for use in this invention is not confined to such a slow-wave structure. Other types of structures, such as space-harmonic structures, may be employed. Most amplifier tubes wherein an electron stream flows in proximity to a slow-wave structure and interacts with a wave propagating therealong, so as to amplify said waves, are suitable for use in this invention. Furthermore, a coaxial line type of microwave circuit is not necessary to the operation of this invention. It is well known, for example, that input and output couplers in traveling-wave amplifiers may have wave-guide structures. Furthermore, attenuators, line stretchers and hybrid junctions employing waveguide structures are well known in the art and are illustrated, for example, in the aforementioned Reintjes publication.

*Traveling-Wave Tube AND-Gate*

Figure 5:
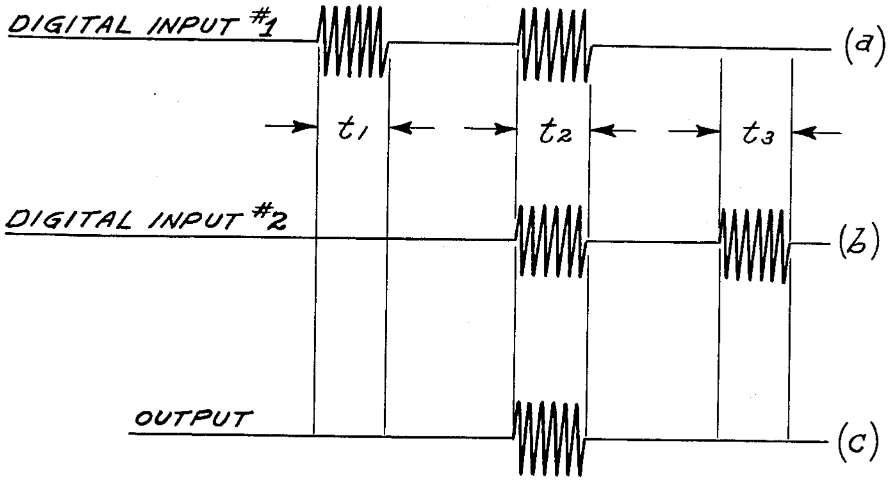
FIGURE 5 is a group of waveforms for illustrating an embodiment of this invention adapted to function as an AND-gate.

The complete circuit illustrated in FIG. 4 is adapted to function as an AND-gate for a binary digital computer. First and second input signals, each representing information in binary digital code, are applied to the circuit at respective input arms 55 and 56 of a hybrid junction 57. The useful output signal of hybrid junction 57 is delivered by output arm 58, which is connected directly to input terminal 40 of the previously described circuit. Output arm 58 is that arm of hybrid junction 57, which will deliver output signals in response to cophasal input signals at arms 55 and 56. Waveforms *a* and *b* of FIG. 5 respectively represent two binary digital coded input signals applied to respective input arms 55 and 56. The presence of a burst or pulse of microwave energy in any designated time interval may be considered as a binary 1, and the absence of such energy as a binary 0. Thus, if the designated time intervals are $t_1$, $t_2$, and $t_3$, as shown, the first input signal represents the binary digital code 110 and the second input signal represents the code 011. At time $t_1$, a signal is applied only to input arm 55. A portion of this signal is transmitted through output arm 58 to the input coupler of traveling-wave tube 41. The level of a single digital input signal, as delivered to the traveling-wave tube input coupler, is so adjusted that it falls below the power threshold level, $P_T$, in FIG. 2. However, it is desirable that the level of this single digital input signal be close to the threshold power. With such a signal applied to the traveling-wave tube, the electron stream does not saturate until it passes beyond the second output coupler, and there is no output signal delivered by hybrid junction 48. Similarly at time $t_3$ there is but one input signal, this to input arm 56, and, consequently, no output signal is delivered by hybrid junction 48. However, at time $t_2$ input signals are applied to both input arms 55 and 56. The superposition of these signals by hybrid junction 57, results in an input signal to traveling-wave tube 41 sufficient to saturate the electron stream before it reaches the second output coupler 24 of FIG. 1, and, therefore, an output signal, also representing a binary 1, is delivered by hybrid junction 48. The output signal delivered hybrid junction 48 is shown in FIG. 5 by waveform *c*, which represents the binary digital code 010. Consequently, the circuit of FIG. 4 delivers an output signal, representing a binary 1, only when two input signals, each representing a binary 1, are applied concurrently to the two input terminals thereof. This circuit, therefore, functions as a binary digital AND-gate.

It is not necessary that the two binary digital coded input signals be applied to the input coupler of traveling-wave tube 41 through a hybrid junction. Instead, a simple T junction, such as is shown on pages 819–825 of the aforementioned Reintjes reference may be employed.

While the principles of the invention have now been made clear in illustrative embodiments, there will be immediately obvious to those skilled in the art many modifications in structure, arrangement, proportions, the elements, materials, and components, used in the practice of the invention, and otherwise, which are particularly adapted for specific environments and operating requirements, without departing from those principles. The appended claims are therefore intended to cover and embrace any such modifications, within the limits only of the true spirit and scope of the invention.

What is claimed is:

1. In combination: means for propagating a stream of charged particles along an extended path; a wave transmission circuit extending along said path and adapted to propagate an electromagnetic wave therealong to interact with said charged particle stream; a wave input means coupled to said circuit and adapted to transfer electromagnetic waves thereto, first and second wave output means coupled to said circuit at spaced locations along said path, each of said wave output means being adapted to abstract electromagnetic waves from said circuit; said input means, said first output means, and said second output means being respectively disposed in succession along said path, attenuating means coupled to said second output means, and amplitude difference sensing means connected to said first output means and the output of said attenuating means for producing a signal in response to the difference in amplitude between the output signals provided by said attenuating means and said first output means.

2. In combination: means for projecting a stream of charged particles along an extended path; a wave transmission circuit extending along said path and adapted to propagate an electromagnetic wave therealong to interact with said charged particle stream; a wave input means coupled to said circuit and adapted to transfer electromagnetic waves thereto; first and second wave output means coupled to said circuit at spaced locations along said path, each of said wave output means being adapted to extract electromagnetic waves from said circuit; said input means, said first output means, and said second output means being respectively disposed in succession along said path, attenuating means coupled to said second output means for decreasing the amplitude of said electromganetic waves extracted by said second output means, and a controllable amplitude signal source coupled to and adapted to apply input signals to said wave input means, said input signals being controllable by said source through an amplitude range adapted to shift the wave saturation point along said circuit from external to the region included between said first and second output means to within said region.

3. A combination as in claim 2 further including amplitude difference sensing means connected to said first output means and to said attenuating means for producing a signal in response to the difference in amplitude between the output signals provided by each of said first output means, and said attenuating means.

4. A combination as in claim 3 wherein said amplitude difference sensing means is adapted to produce no signal when said wave saturation point is external to said region, and to produce a signal variable in accordance with the position of said saturation point within said region.

5. In combination: means for projecting a stream of electrons along an extended path; a slow wave circuit extending along said path and adapted to propagate an electromagnetic wave therealong to interact with said electron stream; a wave input means coupled to said circuit and adapted to transfer electromagnetic waves thereto; first and second wave output means coupled to said circuit at spaced locations along said path, each of said wave output means being adapted to extract electromagnetic waves from said circuit; said input means, said first output means, and said second output means being respectively disposed in succession along said path, comparison means having a pair of input terminals and an output terminal, said comparison means being adapted to receive a signal at each of said input terminals and to deliver an output signal representing the degree of inequality between the amplitudes of the signals received thereby; first signal translation means coupled to said first output means and responsive to the signal extracted thereby for delivering a corresponding signal to one input terminal of said comparison means; and second signal translation means coupled to said second output means and responsive to the signal extracted thereby for delivering a corresponding signal to the other input terminal of said comparison means.

6. In combination: an electron gun for projecting a stream of electrons along an extended path; a slow wave circuit extending along said path and adapted to propagate an electromagnetic wave therealong to interact with said electron stream; a wave input means coupled to said circuit and adapted to transfer electromagnetic waves thereto; first and second wave output means coupled to said circuit at spaced locations along said path, each of said wave output means being adapted to extract electromagnetic waves from said circuit; said input means, said first output means, and said second output means being respectively disposed in succession along said path, said input means being closest to said electron gun; comparison means having a pair of input terminals and an output terminal, said comparison means being adapted to receive a signal at each of said input terminals and to deliver an output signal corresponding to the difference between the amplitudes of the two signals received thereby, a signal delay element connected between said first output means and one input terminal of said comparison means, and a signal attenuator connected between said second output means and the other input terminal of said comparison means.

7. A combination as in claim 6 wherein said attenuator produces a power loss in signals passing therethrough having a numerical value substantially equal to that of the unsaturated power increase of a wave propagating along said circuit from said first output means to said second output means.

8. A combination as in claim 7 wherein said comparison means is a hybrid junction.

9. In combination: an electron gun for projecting a stream of electrons along an extended path; a wave transmission circuit extending along said path and adapted to propagate an electromagnetic wave therealong to interact with said electron stream; a wave input means coupled to said circuit and adapted to transfer electromagnetic waves thereto; first and second wave output means coupled to said circuit at spaced locations along said path, each of said wave output means being adapted to extract electromagnetic waves from said circuit; said input means, said first output means, and said second output means being respectively disposed in succession along said path, said input means being closest to said electron gun; a hybrid junction having a pair of input arms and an output arm, said hybrid junction being adapted to receive a signal at each of said input arms and to deliver an output signal corresponding to the difference between the amplitudes of the two signals received thereby, first signal translation means interconnecting said first output means and one input arm of said hybrid junction; and second signal translation means interconnecting said second output means and the other input arm of said hybrid junction; one of said signal translation means being adapted to modify the amplitude of the signal passing therethrough whereby the amplitudes of the signals arriving at both said hybrid junction input arms are substantially equal.

10. In combination: means for projecting a stream of charged particles along an extended path; a wave transmission circuit extending along said path and adapted to propagate an electromagnetic wave therealong to interact with said charged particle stream; a wave input means coupled to said circuit and adapted to transfer electromagnetic waves thereto; first and second wave output means coupled to said circuit at spaced locations along said path, each of said wave output means being adapted to extract electromagnetic waves from said circuit; said input means, said first output means, and said second output means being respectively disposed in succession along said path; an attenuating means coupled to said second output means for attenuating by a constant amount the waves extracted by said second output means irrespective of the amplitude of the input waves transferred by said wave input means; first and second sources for supplying respective first and second input signals, and means for connecting both of said sources to said wave input means.

11. A combination as in claim 10 wherein each of said first and second sources is adapted to supply an input signal of amplitude such that the wave traveling along said circuit saturates within the region included between said first and second output means only when said first and second input signals are concurrently applied.

12. A logical circuit for employment in a high-speed digital computer comprising an electron gun for projecting a stream of electrons along an extended path, a slow wave circuit extending along said path and adapted to propagate an electromagnetic wave therealong to interact with said electron stream; a wave input means coupled to said circuit and adapted to transfer electromagnetic waves thereto; first and second wave output means coupled to said circuit at spaced locations along said path, each of said wave output means being adapted to extract electromagnetic waves from said circuit; said input means, said first output means, and said second output means being respectively disposed in sucession along said path, said input means being closest to said electron gun; first and second sources for supplying respective first and second input signals; means for connecting both of said sources to said wave input means; comparison means having a pair of input terminals and an output terminal, said comparison means being adapted to receive a signal at each of said input terminals and to deliver an output signal corresponding to the difference between the amplitudes of the two signals received thereby, a signal delay element connected between said first output means and one input terminal of said comparison means, and a signal attenuator connected between said second output means and the other input terminal of said comparison means.

13. A logical circuit as in claim 12 wherein said signal attenuator is adapted to attenuate the amplitude of waves passing therethrough whereby the amplitudes of the signals arriving at both input terminals of said comparison means are substantially equal.

14. A logical circuit as in claim 13 wherein said comparison means is adapted to produce substantially no output signal when the signals applied respectively to the pair of input terminals thereof are equal in amplitude, and to produce an output signal variable in accordance with the difference in amplitude of said signals applied to said signals applied to said pair of input terminals and wherein each of said first and second input signals comprises a series of pulses of microwave electromagnetic energy, representing respectively a binary digital code, and wherein the wave travelling along said circuit saturates within the region included between said first and second output means only when pulses are present concurrently in said first and second input signals.

15. In combination: electromagnetic wave transmitting means having an input and first and second output means, said electromagnetic wave means having a power input versus power output characteristic for said first output means which differs from the power input versus power output characteristics for said second output means by a constant magnitude over a first given range of power input signals, and which differs from said characteristic for said second output means by a magnitude different from said constant magnitude over a second range of power input signals immediately adjacent said first range; means for decreasing the power output from said second output means by an amount equal to said constant magnitude difference; and utilizing means coupled to said power decreasing means and to said first output means for utilizing jointly the output from said power decreasing means and from said first output means.

16. A combination as recited in claim 15 wherein said power decreasing means decreases said power by said constant amount independent of within which of said first and second ranges the power input to said electromagnetic wave supporting means falls at any time.

17. A combination as recited in claim 15 wherein said power input versus power output characteristic relative to said first and second output means are both linear over said first power input range, and at least one of said characteristics is non-linear over said second power input range.

18. A combination as recited in claim 15 wherein said utilizing means comprises a comparing means coupled to said power decreasing means and to said first output means for comparing the magnitudes of the output from said power decreasing means and the output from said first output means.

19. A combination as recited in claim 15, including means for applying input signals to said electromagnetic wave transmitting means which can have at least two discrete values, one of which falls within said first range of power input signals and the other of which falls within said second range of power input signals.

References Cited in the file of this patent

UNITED STATES PATENTS

| | | |
|---|---|---|
| 2,473,457 | Tyson | June 14, 1949 |
| 2,519,763 | Hoglund | Aug. 22, 1950 |
| 2,593,113 | Cutler | Apr. 15, 1952 |
| 2,685,039 | Scarbrough et al. | July 27, 1954 |

(Other references on following page)

UNITED STATES PATENTS

| | | |
|---|---|---|
| 2,804,511 | Kompfner | Aug. 27, 1957 |
| 2,811,673 | Kompfner | Oct. 29, 1957 |
| 2,866,949 | Tillotson | Dec. 30, 1958 |
| 2,894,168 | Wing et al. | July 7, 1959 |
| 2,925,522 | Kelliher | Feb. 16, 1960 |

FOREIGN PATENTS

| | | |
|---|---|---|
| 733,063 | Great Britain | July 6, 1955 |

OTHER REFERENCES

Pub. I, Principles of Radar, 3rd. edition, Reintjes and Coate, 1952, McGraw-Hill, pp. 825–839.

UNITED STATES PATENT OFFICE

CERTIFICATE OF CORRECTION

Patent No. 3,037,168 May 29, 1962

Max P. Forrer

It is hereby certified that error appears in the above numbered patent requiring correction and that the said Letters Patent should read as corrected below.

Column 7, line 74, for "mganetic" read -- magnetic --; column 10, line 17, strike out "said signals applied to"; line 30 for "characteristics" read -- characteristic --.

Signed and sealed this 2nd day of October 1962.

SEAL)
Attest:

ERNEST W. SWIDER
Attesting Officer

DAVID L. LADD
Commissioner of Patents